US010060808B2

(12) United States Patent
Toyama

(10) Patent No.: US 10,060,808 B2
(45) Date of Patent: Aug. 28, 2018

(54) TORQUE DETECTOR

(71) Applicant: JTEKT CORPORATION, Osaka-shi, Osaka (JP)

(72) Inventor: Yuichi Toyama, Owariasahi (JP)

(73) Assignee: JTEKT CORPORATION, Osaka-shi (JP)

( * ) Notice: Subject to any disclaimer, the term of this patent is extended or adjusted under 35 U.S.C. 154(b) by 0 days.

(21) Appl. No.: 15/497,559

(22) Filed: Apr. 26, 2017

(65) Prior Publication Data

US 2017/0315004 A1    Nov. 2, 2017

(30) Foreign Application Priority Data

Apr. 28, 2016 (JP) ................................. 2016-091394

(51) Int. Cl.
*G01L 3/00* (2006.01)
*G01L 3/10* (2006.01)
*G01R 33/00* (2006.01)

(52) U.S. Cl.
CPC .......... *G01L 3/104* (2013.01); *G01R 33/0011* (2013.01)

(58) Field of Classification Search
CPC ............................ G01R 33/0011; G01L 3/104
USPC .................................................... 73/862.331
See application file for complete search history.

(56) References Cited

U.S. PATENT DOCUMENTS

| 2010/0071481 | A1* | 3/2010 | Arita | ........................ | B62D 6/10 |
| | | | | | 73/862.333 |
| 2011/0005340 | A1* | 1/2011 | Jeon | ........................ | B62D 6/10 |
| | | | | | 73/862.193 |
| 2015/0033877 | A1* | 2/2015 | Hotta | ................... | B62D 5/0481 |
| | | | | | 73/862.193 |
| 2017/0254710 | A1* | 9/2017 | Lee | ...................... | B62D 15/021 |

FOREIGN PATENT DOCUMENTS

| EP | 2 749 856 A1 | 7/2014 |
| EP | 2 833 110 A1 | 2/2015 |
| JP | 2013-160535 A | 8/2013 |
| JP | 2014-029304 A | 2/2014 |
| JP | 2015-031600 A | 2/2015 |

OTHER PUBLICATIONS

Sep. 29, 2017 Search Report issued in European Patent Application No. 17168043.2.

* cited by examiner

*Primary Examiner* — Max Noori

(74) *Attorney, Agent, or Firm* — Oliff PLC

(57) ABSTRACT

There is provided a torque detector configured such that a magnetic shield is fixed to a holder without the need for a component for fixation of the magnetic shield, and no backlash is caused between the magnetic shield and the holder after the magnetic shield is fixed to the holder. The torque detector has engagement grooves into which a magnetic shield is to be inserted when the magnetic shield is fitted onto outer peripheral surfaces of a first holder and a second holder. The magnetic shield has end portions to be inserted into the engagement grooves, and each of the end (Continued)

portions is provided with engaging members that are always engaged with inner surfaces of the engagement grooves, respectively, while being inserted into the engagement grooves, to restrict movement of the end portions in the counter-insertion direction.

6 Claims, 6 Drawing Sheets

TORQUE DETECTOR

INCORPORATION BY REFERENCE

The disclosure of Japanese Patent Application No. 2016-091394 filed on Apr. 28, 2016 including the specification, drawings and abstract, is incorporated herein by reference in its entirety.

BACKGROUND OF THE INVENTION

1. Field of the Invention

The invention relates to a torque detector.

2. Description of the Related Art

Japanese Patent Application Publication No. 2014-29304 (JP 2014-29304 A), Japanese Patent Application Publication No. 2013-160535 (JP 2013-160535 A), and Japanese Patent Application Publication No. 2015-31600 (JP 2015-31600 A) each describe an example of a torque detector provided with a magnetic shield. The torque detector includes an input shaft and an output shaft that are coaxially coupled to each other via a torsion bar, a permanent magnet fixed to the input shaft, a plurality of magnetic yokes fixed to the output shaft and disposed within a magnetic field of the permanent magnet to form a magnetic circuit, a pair of magnetic convergence rings configured to induce magnetic fluxes from the magnetic yokes, and a magnetic sensor configured to detect the magnetic fluxes induced by the magnetic convergence rings. The magnetic convergence rings respectively have protrusions disposed so as to face each other. The magnetic sensor is disposed between the protrusions. The magnetic shield is disposed so as to surround the magnetic convergence rings. The magnetic shield blocks external magnetic field noises that affect the torque detector, such as noises caused by turning on and off electric components mounted in a vehicle, noises caused by high-voltage power-transmission lines, and noises emanating from roads or surrounding buildings.

According to JP 2014-29304 A, JP 2013-160535 A, and JP 2015-31600 A, the magnetic shield having a C-shaped section is fitted onto a cylindrical holder provided with the magnetic convergence rings. According to JP 2014-29304 A, in order to fit the magnetic shield having a C-shape onto the cylindrical holder, bent portions provided at the opposite end portions of the magnetic shield are engaged into fitting grooves provided in an outer peripheral surface of the holder, with the distance between the opposite end portions of the magnetic shield increased against a spring force of the magnetic shield.

According to JP 2013-160535 A, in order to fit the magnetic shield having a C-shape onto the cylindrical holder, the distance between the opposite end portions of the magnetic shield is increased against a spring force of the magnetic shield, and the magnetic shield is fitted onto the holder, as in JP 2014-29304 A. Then, the opposite end portions of the magnetic shield are inserted, in a circumferential direction of the holder, into grooves provided in a pair of engagement portions of the holder. In this way, movement of the magnetic shield in the circumferential direction is prevented at the bottoms of the grooves.

In JP 2015-31600 A, the holder includes a pair of holder-halves having shapes obtained by splitting the holder into two pieces in the up-down direction. The holder-halves in a separated state are fitted into the magnetic shield having a C-shape from the respective axial end sides of the magnetic shield. Then, the opposite end portions of the magnetic shield are inserted into grooves provided in a pair of engagement portions of each of the holder-halves. In this way, movement of the magnetic shield in the circumferential direction in the holder is prevented at the bottoms of the grooves.

In JP 2014-29304 A and JP 2013-160535 A, in order to fit the magnetic shield having a C-shape onto the cylindrical holder, the distance between the opposite end portions of the magnetic shield is increased, and the magnetic shield is fitted to the holder with the distance between the opposite end portions of the magnetic shield increased. However, when the magnetic shield or the holder has a dimensional deviation, a backlash is caused after the magnetic shield is fitted to the holder.

With the technology described in JP 2015-31600 A, when the magnetic shield or the holder has a dimensional deviation, a backlash is caused after the magnetic shield is fitted to the holder, as in JP 2013-160535 A. In some cases, a magnetic shield is fastened to a holder with screws. However, fastening members, such as screws, are required. This increases the number of components, resulting in a cost increase.

SUMMARY OF THE INVENTION

One object of the invention is to provide a torque detector configured such that a magnetic shield is fixed to a holder without the need for a component for fixation of the magnetic shield, and no backlash is caused between the magnetic shield and the holder after the magnetic shield is fixed to the holder.

A torque detector according to an aspect of the invention includes: a permanent magnet; a magnetic yoke disposed within a magnetic field formed by the permanent magnet, the magnetic yoke configured such that a position of the magnetic yoke relative to the permanent magnet varies; a magnetic convergence unit having a cylindrical shape, the magnetic convergence unit including a magnetic convergence ring holder having a cylindrical shape so as to surround the magnetic yoke, a magnetic convergence ring attached to an inner peripheral surface of the magnetic convergence ring holder to collect a magnetic flux of the magnetic yoke, and a magnetic shield fitted and attached onto an outer peripheral surface of the magnetic convergence ring holder; and a magnetic sensor configured to detect a magnetic flux of a magnetic circuit formed by the permanent magnet, the magnetic yoke, and the magnetic convergence ring. The outer peripheral surface of the magnetic convergence ring holder has an insertion portion into which the magnetic shield is inserted when the magnetic shield is fitted onto the magnetic convergence ring holder. The magnetic shield has an inserting portion to be inserted into the insertion portion. The inserting portion has an engaging member that is always engaged with an inner surface of the insertion portion to restrict movement of the inserting portion in a counter-insertion direction while the inserting portion is inserted in the insertion portion.

With the structure described above, even when the inserting portion attempts to move in the counter-insertion direction, movement of the inserting portion in the counter-insertion direction is restricted by the engaging member that is always engaged with the inner surface of the insertion portion.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Hereinafter, a torque detector according to a first embodiment of the invention will be described with reference to FIGS. 1 to 7.

Figure 1:
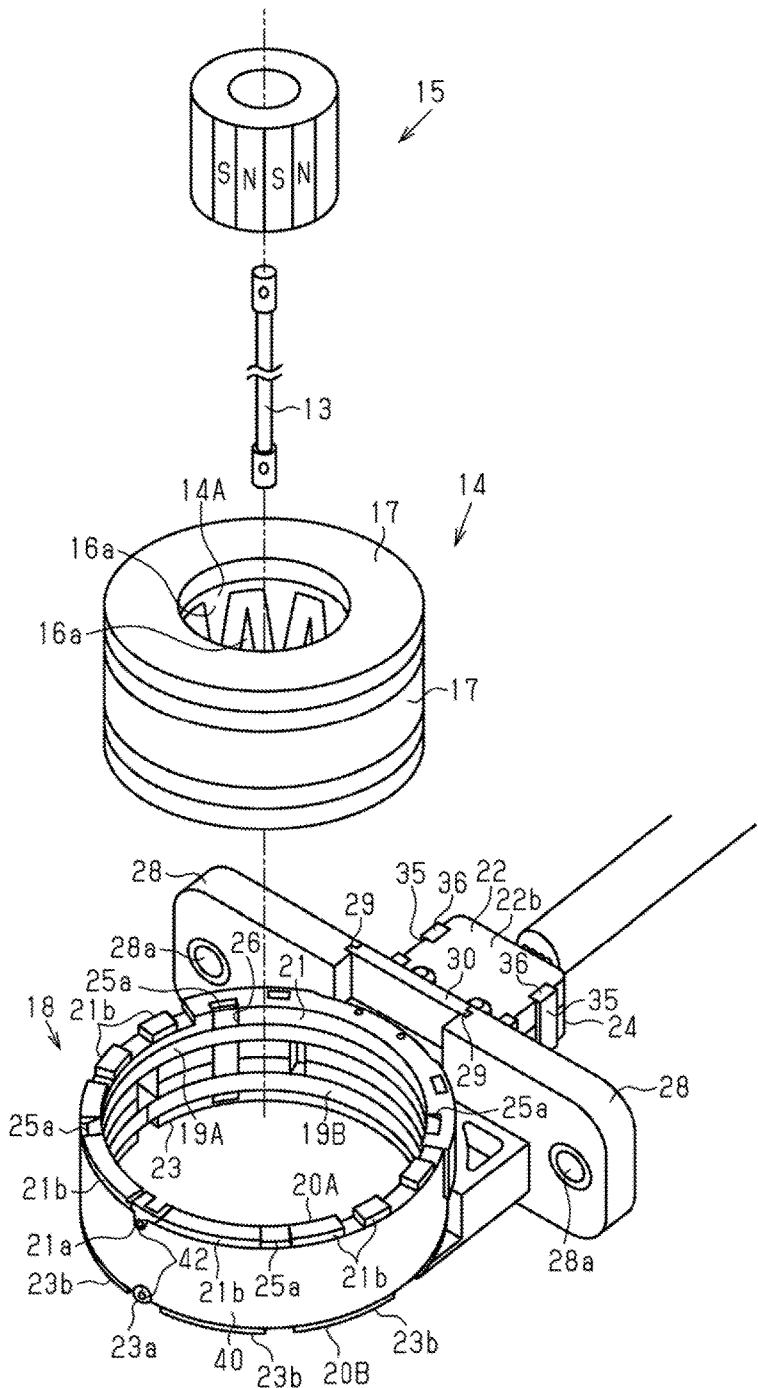
FIG. 1 is an exploded perspective view illustrating the structure of a torque detector according to an embodiment.

As illustrated in FIG. 1, the torque detector includes a torsion bar 13 that couples an input shaft 11 and an output shaft 12 to each other (refer to FIG. 2), a permanent magnet 15 coupled to the input shaft 11, a yoke 14 coupled to the output shaft 12, and a magnetic convergence unit 18 having a cylindrical shape and disposed so as to surround the yoke 14.

Figure 2:
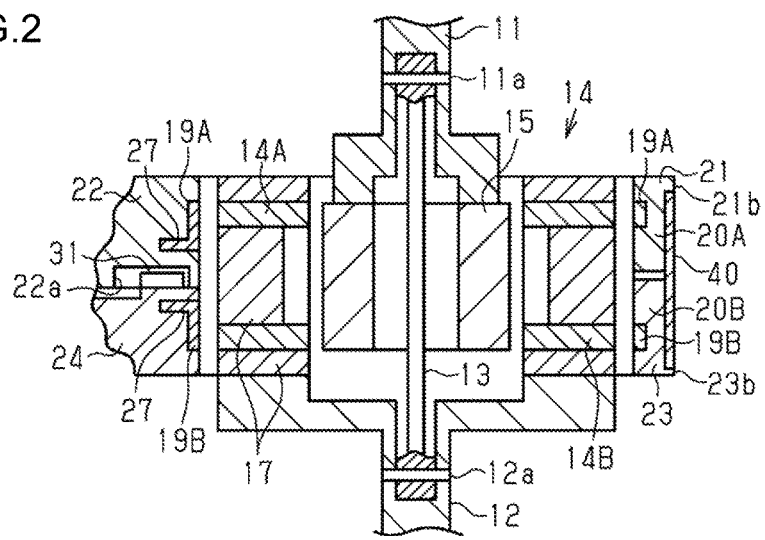
FIG. 2 is a sectional view illustrating the structure of the torque detector according to the embodiment.

As illustrated in FIG. 2, the torsion bar 13 has a diameter smaller than that of each of the input shaft 11 and the output shaft 12, and the torsion bar 13 is coaxially coupled to the input shaft 11 and the output shaft 12. The torsion bar 13 is coupled at its respective ends to the input shaft 11 and the output shaft 12 in an integral manner with a pin 11a and a pin 12a. As illustrated in FIG. 2, the permanent magnet 15 coupled to the input shaft 11 is a cylindrical member having, for example, 24 poles (12 north poles and 12 south poles) that are magnetized at equal intervals in a circumferential direction, and the permanent magnet 15 is coaxially fixed to the input shaft 11. The number of poles is not limited to the number described above.

As illustrated in FIG. 2, the yoke 14 having a cylindrical shape is coaxially fixed to the output shaft 12. The yoke 14 is disposed so as to surround the permanent magnet 15 with an appropriate clearance left between the yoke 14 and the permanent magnet 15 in the radial direction.

As illustrated in FIG. 2, the yoke 14 includes two magnetic yokes 14A, 14B (soft magnetic bodies). The magnetic yokes 14A, 14B each include a ring 16 having a plate shape and twelve isosceles triangular lugs 16a provided on the ring 16 at equal intervals in the circumferential direction and extending from a plate surface of the ring 16 in a direction perpendicular to the plate surface of the ring 16. The magnetic yokes 14A, 14B are molded into a cylindrical shape with a synthetic resin material 17, with the lugs 16a of the magnetic yoke 14A and the lugs 16a of the magnetic yoke 14B are offset from each other at appropriate intervals in the circumferential direction. As illustrated in FIG. 1, a surface of each of the magnetic yokes 14A, 14B that faces the permanent magnet 15 is not covered with the synthetic resin material 17.

The magnetic yokes 14A, 14B are disposed such that tip ends of the lugs 16a point the boundaries between the north poles and the south poles of the permanent magnet 15 in a neutral state where no torque is applied to the input shaft 11.

As illustrated in FIG. 1, the magnetic convergence unit 18 includes two magnetic convergence rings 19A, 19B that are magnetically connected to the magnetic yokes 14A, 14B to induce magnetic fluxes from the magnetic yokes 14A, 14B, respectively, a first holder 20A and a second holder 20B that hold the magnetic convergence rings 19A, 19B, respectively, and a magnetic shield 40 that surrounds the magnetic convergence rings 19A, 19B in the circumferential direction, and so forth. In the present embodiment, the first holder 20A and the second holder 20B constitute a magnetic convergence ring holder. That is, the magnetic convergence ring holder is formed by arranging, in the axial direction, the first holder 20A and the second holder 20B having a similar shape as viewed from the axial direction, and assembling the first holder 20A and the second holder 20B together. The magnetic convergence ring holder according to the present embodiment may be regarded as a magnetic convergence ring holder having a shape obtained by splitting a conventional single-piece magnetic convergence ring holder into two pieces in the axial direction.

Figure 4:
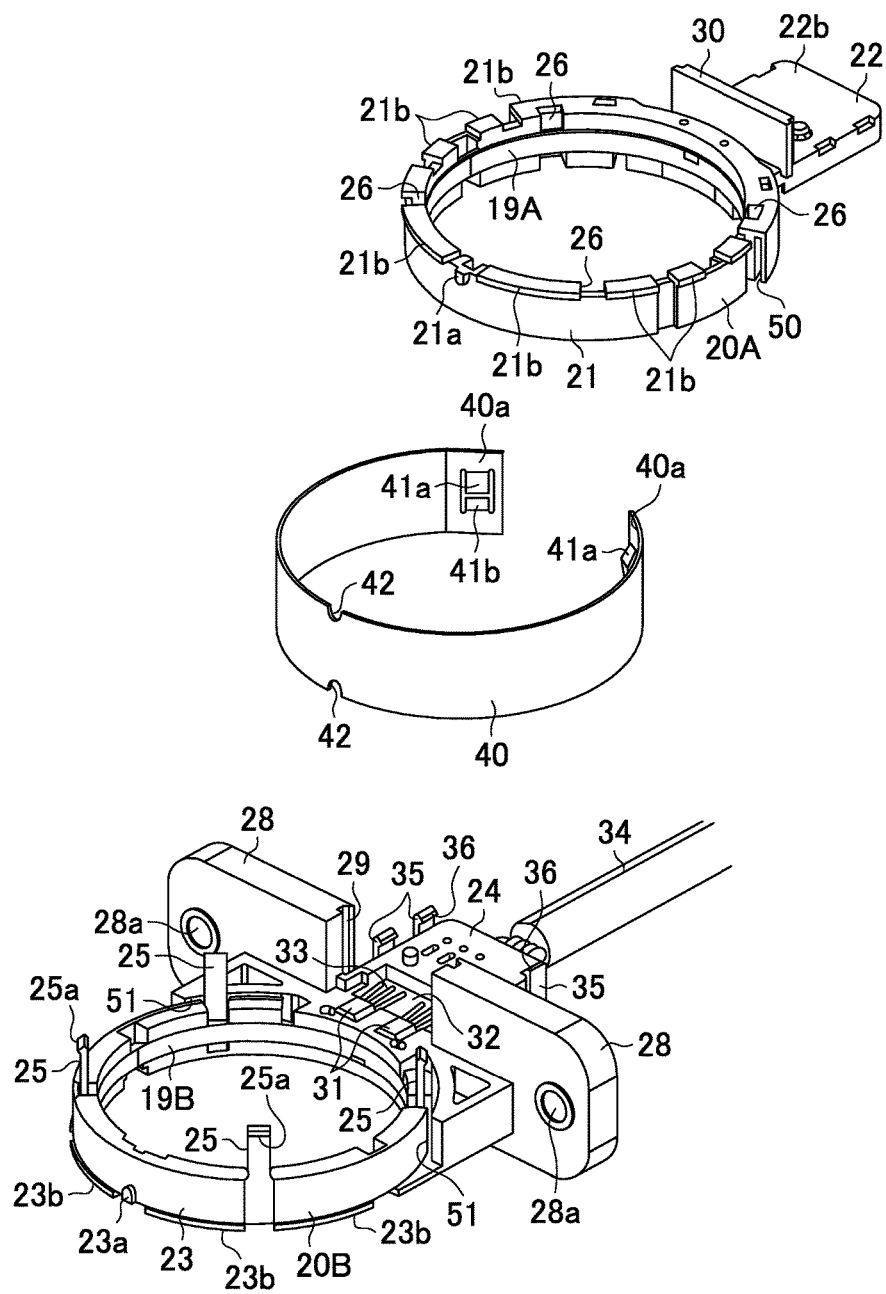
FIG. 4 is an exploded perspective view of a magnetic convergence unit according to the embodiment.

As illustrated in FIG. 4, the first holder 20A is made of synthetic resin, and the first holder 20A includes a ring portion 21 having an annular shape, and a circuit cover portion 22 having a lidded box shape and integrally coupled to an outer peripheral surface of the ring portion 21 to project radially outward. The magnetic convergence ring 19A is held in an inner peripheral surface of the ring portion 21, and the magnetic convergence ring 19A is disposed so as to face an outer peripheral surface of the yoke 14 as illustrated in FIG. 2. The magnetic convergence ring 19A is made of a soft magnetic body. That is, a surface of each of the magnetic yokes 14A, 14B and a surface of the magnetic convergence ring 19A, the surfaces facing each other, are disposed to face each other while being exposed. An axial direction of the first holder 20A is a direction of a central axis of the ring portion 21.

As illustrated in FIG. 1 and FIG. 4, a positioning protrusion 21a protruding radially outward and a plurality of flange pieces 21b are provided at a peripheral portion at an axial end of the ring portion 21, which is on the side away from the second holder 20B.

As illustrated in FIG. 4, the second holder 20B is made of synthetic resin, and the second holder 20B includes a ring portion 23 having an annular shape, and a substrate mounting portion 24 having a quadrangular plate shape and integrally coupled to an outer peripheral surface of the ring portion 23 to project radially outward. The ring portion 23 has an inner peripheral surface and an outer peripheral surface each of which has a diameter identical to that of a corresponding one of the inner peripheral surface and the outer peripheral surface of the ring portion 21 of the first holder 20A. The magnetic convergence ring 19B is held in an inner peripheral surface of the ring portion 23, and the magnetic convergence ring 19B is disposed so as to face the outer peripheral surface of the yoke 14 as illustrated in FIG. 2. The magnetic convergence ring 19B is made of a soft magnetic body. That is, the surface of each of the magnetic yokes 14A, 14B and a surface of the magnetic convergence ring 19B, the surfaces facing each other, are disposed to face each other while being exposed. An axial direction of the second holder 20B is a direction of a central axis of the ring portion 23.

As illustrated in FIG. 4, the outer peripheral surface of the ring portion 23 of the second holder 20B is provided with a plurality of engaging protrusions 25 protruding toward the first holder 20A. A plurality of fitting grooves 26 is provided in the inner peripheral surface of the ring portion 21 of the first holder 20A. The engaging protrusions 25 are fitted into the fitting grooves 26, and an engagement lug 25a at the distal end of each of the engaging protrusions 25 is hooked on an axial end face of the ring portion 21 of the first holder 20A. As described above, the second holder 20B is disposed coaxially with the first holder 20A by hooking the engaging protrusions 25 on the ring portion 21 of the first holder 20A.

As illustrated in FIG. 1 and FIG. 4, a positioning protrusion 23a protruding radially outward and a plurality of flange pieces 23b are provided at a peripheral portion at an axial end of the ring portion 23, which is on the side away from the first holder 20A.

Figure 5:
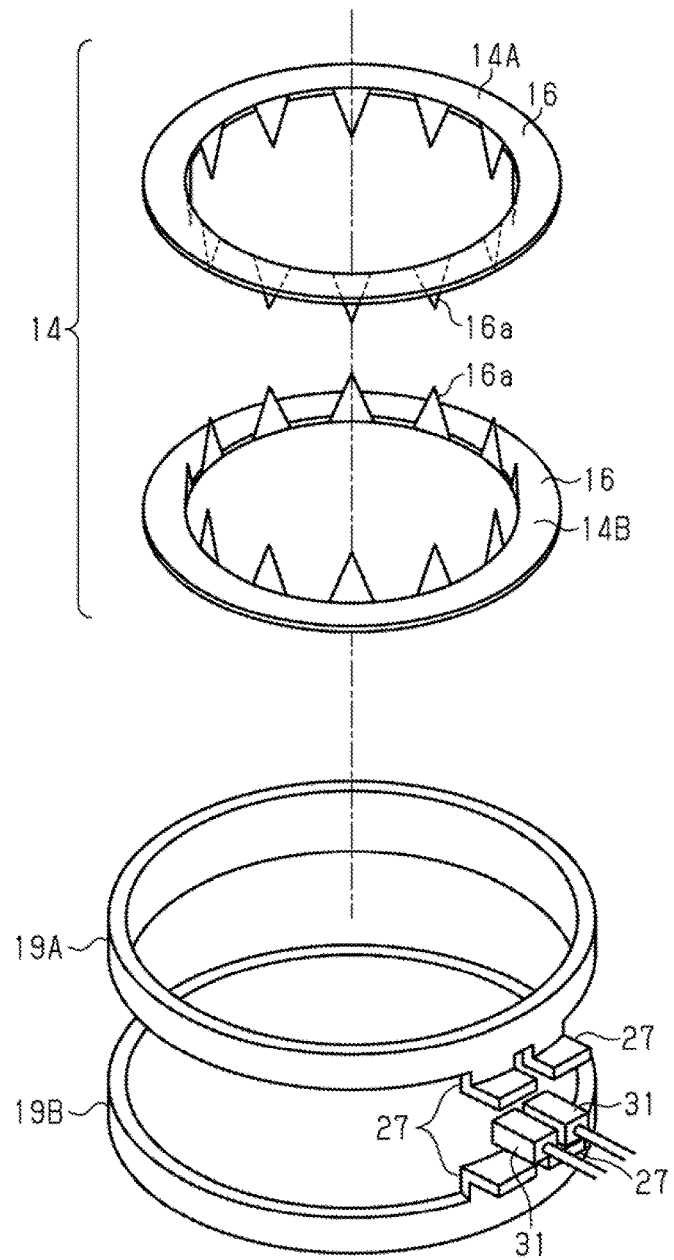
FIG. 5 is an exploded perspective view illustrating magnetic yokes and magnetic convergence rings of the torque detector.

As illustrated in FIG. 5, the two magnetic convergence rings 19A, 19B are disposed parallel to each other, and the magnetic convergence rings 19A, 19B have protrusions 27 having a flat plate shape. The distance between the protrusion 27 of the magnetic convergence ring 19A and the protrusion 27 of the magnetic convergence ring 19B is shorter than the distance between the remaining portion of the magnetic convergence ring 19A and the remaining portion of the magnetic convergence ring 19B. At least one Hall IC 31 is inserted into a clearance between the protrusions 27 that are close to each other. The Hall IC 31 is an example of a magnetic sensor. The magnetic sensor is not limited to the Hall IC 31, and may be another sensor, such as a Hall element, a magnetoresistance effect element, or a magnetic impedance element.

As illustrated in FIG. 4, the Hall ICs 31 are fixed to an inner surface of the substrate mounting portion 24 together with a circuit board 32 (electronic circuit member) provided with an electronic circuit connected to the Hall ICs 31. The Hall ICs 31 are connected to the circuit on the circuit board 32 by a plurality of lead wires 33. The circuit board 32 is connected to an external control device (not illustrated) through a cord 34.

The circuit cover portion 22 is stacked on the substrate mounting portion 24, and a circuit housing chamber 22a is defined between the circuit cover portion 22 and the substrate mounting portion 24, as illustrated in FIG. 2. The Hall ICs 31, the circuit board 32, the lead wires 33, and so forth, are housed in the circuit housing chamber 22a.

As illustrated in FIG. 1 and FIG. 4, the side faces of the substrate mounting portion 24 are provided with engaging protrusions 35 protruding on the circuit cover portion 22-side. The stacked state of the circuit cover portion 22 and the substrate mounting portion 24 is maintained when engagement lugs 36 provided at the distal ends of the engaging protrusions 35 are engaged with an edge portion of a top wall 22b of the circuit cover portion 22.

Figure 3:
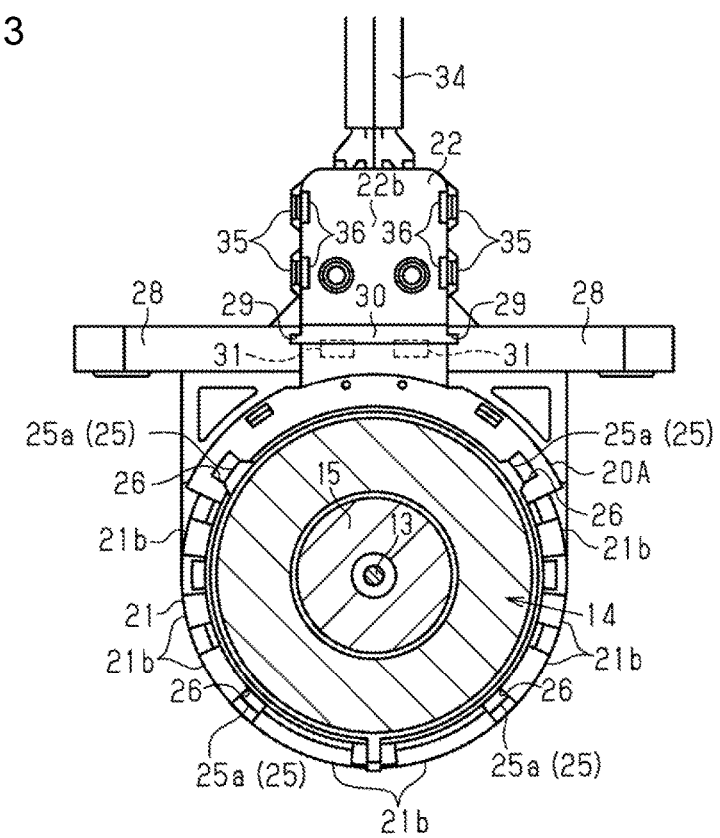
FIG. 3 is a plan view of the torque detector according to the embodiment, including a partial sectional view of the torque detector.

As illustrated in FIG. 1 and FIG. 4, a pair of flanges 28 is provided across the side faces of the substrate mounting portion 24 at its base end. As illustrated in FIG. 1 and FIG. 3, a base end of the circuit cover portion 22 is fitted into a clearance between the flanges 28. In addition, a guide groove 29 is provided in each of end faces of both the flanges 28, which face each other, so as to extend in a direction in which the circuit cover portion 22 is stacked on the substrate mounting portion 24. The circuit cover portion 22 is provided with a partition wall 30 having a plate shape. The partition wall 30 is fitted in the guide grooves 29. When the circuit cover portion 22 is stacked on the substrate mounting portion 24, the partition wall 30 is fitted into the guide grooves 29 to guide the first holder 20A such that the first holder 20A is stacked onto the second holder 20B. Each flange 28 has a mounting hole 28a extending through the flange 28. The mounting hole 28a is used to attach the flange 28 to a housing (not illustrated) of an electric power steering system or the like.

Figure 6:
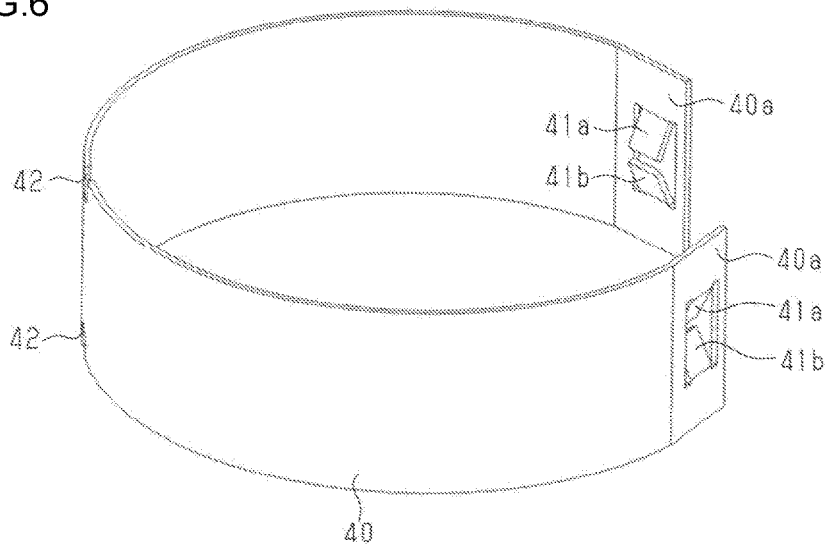
FIG. 6 is a perspective view of a magnetic shield.

As illustrated in FIG. 1, FIG. 4, and FIG. 6, the magnetic shield 40 is fitted onto the outer peripheral surface of the ring portion 21 of the first holder 20A and the outer peripheral surface of the ring portion 23 of the second holder 20B. The magnetic shield 40 is made of metal. The magnetic shield 40 is formed by curving, for example, a metal plate made of steel such that the magnetic shield 40 has a C-shaped section. A substantially-half portion of the magnetic shield 40 in the axial direction is fitted onto the first holder 20A and the other substantially-half portion of the magnetic shield 40 in the axial direction is fitted onto the second holder 20B. Thus, magnetic fluxes from the input shaft 11 and the output shaft 12 in the radial direction are blocked.

The axial length of the magnetic shield 40 is slightly longer than the sum of the axial length of the ring portion 21 of the first holder 20A and the axial length of the ring portion 23 of the second holder 20B. The respective axial end portions of the magnetic shield 40 are in contact with the flange pieces 21b of the ring portion 21 and the flange pieces 23b of the ring portion 23, with the engagement lugs 25a of the engaging protrusions 25 hooked on the axial end face of the ring portion 21 of the first holder 20A.

In addition, each of end portions 40a of the magnetic shield 40 at its opposite sides in the circumferential direction has a plate shape. The magnetic shield 40 has recessed portions 42 for positioning. In the magnetic shield 40 having a C-shaped section, the recessed portions 42 are provided at positions that are at respective axial ends and that are at substantially the center in the circumferential direction. When the protrusion 21a of the ring portion 21 and the protrusion 23a of the ring portion 23 are fitted into the recessed portions 42 for positioning, the magnetic shield 40 is positioned, in the circumferential direction, with respect to the first holder 20A and the second holder 20B. Each end portion 40a may function as an inserting portion.

As illustrated in FIG. 4, engagement grooves 50 are provided in portions of the first holder 20A, which correspond to the respective end portions 40a of the magnetic shield 40, that is, in portions of the first holder 20A that are close to the Hall ICs 31. Each engagement groove 50 of the first holder 20A is open on the side away from the Hall IC 31 in the circumferential direction of the ring portion 21, and is also open on the second holder 20B-side. Each engagement groove 50 of the first holder 20A is closed on the Hall IC 31-side of the engagement groove 50 in the circumferential direction of the ring portion 21, and is also closed on the side away from the second holder 20B.

Figure 7A:
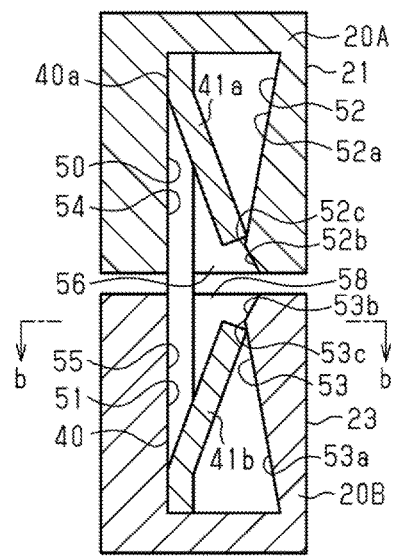
FIG. 7A is a sectional view illustrating a state of engagement between an inserting portion of the magnetic shield and an insertion portion of a magnetic convergence ring holder.
Figure 7B:
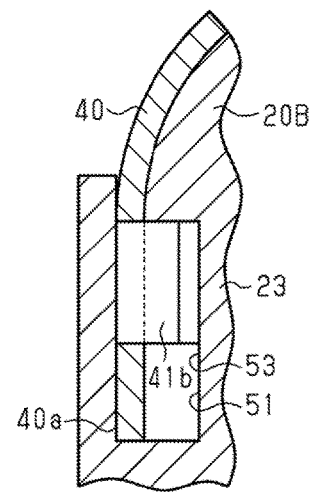
FIG. 7B is a sectional view taken along line b-b in FIG. 7A.

As illustrated in FIG. 7A, in the engagement groove 50, an inner surface 54 on the side away from the axis of the ring portion 21 in its radial direction has a flat surface configured to extend along the end portion 40a having a plate shape, and an inner surface 52 on the side close to the axis of the ring portion 21 in its radial direction has a tapered surface 52a configured such that distance between the tapered surface 52a and the inner surface 54 facing the tapered surface 52a decreases toward an opening 56 on the second holder 20B-side.

In the opening 56, a surface extending toward the second holder 20B from an apex portion 52c of the tapered surface 52a, which is on the opening 56-side, defines a guide face 52b. The distance between the tapered surface 52a and the inner surface 54 is the shortest at the apex portion 52c. The distance between the guide face 52b and the inner surface 54 increases toward the second holder 20B.

As illustrated in FIG. 4, engagement grooves 51 are provided in portions of the second holder 20B, which correspond to the respective end portions 40a of the magnetic shield 40, that is, in portions of the second holder 20B that are close to the Hall ICs 31. Each engagement groove 51 of the second holder 20B is open on the side away from the Hall IC 31 in the circumferential direction of the ring portion 23, and is also open on the first holder 20A-side. Each engagement groove 51 of the second holder 20B is closed on the Hall IC 31-side of the engagement groove 51 in the circumferential direction of the ring portion 23, and is also closed on the side away from the first holder 20A.

As illustrated in FIG. 7A, in the engagement groove 51, an inner surface 55 on the side away from the axis of the ring portion 23 in its radial direction has a flat surface configured to extend along the end portion 40a having a plate shape, and an inner surface 53 on the side close to the axis of the ring portion 23 in its radial direction has a tapered surface 53a configured such that distance between the tapered surface 53a and the inner surface 55 facing the tapered surface 53a decreases toward an opening 58 on the first holder 20A-side. In the opening 58, a surface extending toward the first holder 20A from an apex portion 53c of the tapered surface 53a, which is on the opening 58-side, defines a guide face 53b. The distance between the tapered surface 53a and the inner surface 55 is the shortest at the apex portion 53c. The distance between the guide face 53b and the inner surface 55 increases toward the first holder 20A. Each of the engagement grooves 50, 51 may function as an insertion portion.

As illustrated in FIG. 4 and FIG. 6, the end portions 40a of the magnetic shield 40 in the circumferential direction are inserted into the engagement grooves 50, 51. As illustrated in FIG. 7A, each of the end portions 40a has an engaging member 41a that is brought into contact with the tapered surface 52a of the engagement groove 50, which is on the side close to the axis of the ring portion 21 in its radial direction, and an engaging member 41b that is brought into contact with the tapered surface 53a of the engagement groove 51, which is on the side close to the axis of the ring portion 23 in its radial direction.

In the present embodiment, the engaging members 41a, 41b each have elasticity, and the engaging members 41a, 41b each have a free end. The free ends of the engaging members 41a, 41b are configured so as to face each other and to project from a surface of the magnetic shield 40. That is, the engaging members 41a, 41b are formed through lancing so as to be raised radially inward from the end portion 40a of the magnetic shield 40, and are elastically engaged with the tapered surfaces 52a, 53a.

In the present embodiment, an insertion direction in which the engaging member 41a is inserted into the engagement groove 50 is a depth direction extending from the opening 56 as an insertion slot in FIG. 7A (an upward direction in FIG. 7A). When the end portion 40a is inserted into the engagement groove 50, an outer surface of the end portion 40a is brought into sliding contact with the inner surface 54 of the engagement groove 50. Then, the distal end of the engaging member 41a is guided by the guide face 52b in the opening 56. When the end portion 40a (magnetic shield 40) is moved until an end face of the end portion 40a in its axial direction, which is on the side away from the second holder 20B, is brought into contact with a bottom of the engagement groove 50, the engaging member 41a deflects toward the inner surface 54 against its own elastic force until the distal end of the engaging member 41a reaches the apex portion 52c. When the distal end of the engaging member 41a passes through the apex portion 52c, the distal end of the engaging member 41a is elastically engaged with the tapered surface 52a (refer to FIG. 7A and FIG. 7B). The tapered surface 52a is configured such that the distance between the tapered surface 52a and the inner surface 54 decreases toward the opening 56 (in a counter-insertion direction). Thus, movement of the engaging member 41a, that is, movement of the magnetic shield 40 in the counter-insertion direction is restricted.

An insertion direction in which the engaging member 41b is inserted into the engagement groove 51 is a depth direction extending from the opening 58 as an insertion slot in FIG. 7A (a downward direction in FIG. 7A). When the end portion 40a is inserted into the engagement groove 51, an outer surface of the end portion 40a is brought into sliding contact with the inner surface 55 of the engagement groove 51. Then, the distal end of the engaging member 41b is guided by the guide face 53b in the opening 58. When the end portion 40a (magnetic shield 40) is moved until an end face of the end portion 40a in its axial direction, which is on the side away from the first holder 20A, is brought into contact with a bottom of the engagement groove 51, the engaging member 41b deflects toward the inner surface 55 against its own elastic force until the distal end of the engaging member 41b reaches the apex portion 53c. When the distal end of the engaging member 41b passes through the apex portion 53c, the distal end of the engaging member 41b is elastically engaged with the tapered surface 53a (refer to FIG. 7A and FIG. 7B). The tapered surface 53a is configured such that the distance between the tapered surface 53a and the inner surface 55 decreases toward the opening 58 (in a counter-insertion direction). Thus, movement of the engaging member 41b, that is, movement of the magnetic shield 40 in the counter-insertion direction is restricted.

Next, the operation of the torque detector configured as described above will be described. Since the principle of torque detection by a torque detector is publicly known, the principle will be briefly described. When the input shaft 11 illustrated in FIG. 2 is operated to cause an angular difference between the permanent magnet 15 coupled through the torsion bar 13 and the magnetic yokes 14A, 14B, magnetic fluxes of the permanent magnet 15 are transmitted to the magnetic convergence ring 19A, 19B from the magnetic yokes 14A, 14B, respectively. When a magnetic flux in proportion to a torsion angle of the torsion bar 13 is transmitted to each Hall IC 31 sandwiched between the protrusions 27 of the magnetic convergence rings 19A, 19B, a steering torque is detected.

In the present embodiment, even when the end portion 40a of the magnetic shield 40 attempts to move in the counter-insertion direction, movement of the end portion 40a in the counter-insertion direction is restricted by the engaging members 41a, 41b that are always engaged with the inner surfaces of the engagement grooves 50, 51, respectively. As a result, the magnetic shield 40 is fixed to the first holder 20A and the second holder 20B without the need for a component for fixation of the magnetic shield 40, and no backlash is caused between the magnetic shield 40, and the first and second holders 20A, 20B.

The present embodiment has the following features.

(1) The torque detector according to the present embodiment has the engagement grooves 50, 51 (insertion portions) into which the magnetic shield 40 is to be inserted when the magnetic shield 40 is fitted onto the outer peripheral surfaces of the first holder 20A and the second holder 20B (magnetic convergence ring holders). The magnetic shield 40 has the end portions 40a (inserting portions) that are to be inserted into the engagement grooves 50, 51 (insertion portions), and each of the end portions 40a is provided with the engaging members 41a, 41b that are always engaged with the inner surfaces of the engagement grooves 50, 51 (insertion portions), respectively, while being inserted into the engagement grooves 50, 51 (insertion portions), to restrict movement of the end portions 40a (inserting portions) in the counter-insertion direction. With the structure described above, even when the end portion 40a (inserting portion) of the magnetic shield 40 attempts to move in the counter-insertion direction, movement of the end portion 40a (inserting portion) in the counter-insertion direction is restricted by the engaging members 41a, 41b that are always engaged with the inner surfaces of the engagement grooves 50, 51 (insertion portions), respectively. As a result, the magnetic shield 40 is fixed to the first holder 20A and the second holder 20B without the need for a component for fixation of the magnetic shield 40, and no backlash is caused between the magnetic shield 40, and the first and second holders 20A, 20B.

(2) The magnetic convergence ring holder of the torque detector according to the present embodiment includes the first holder 20A and the second holder 20B that have shapes obtained by splitting the magnetic convergence ring holder into two pieces in the axial direction and that are assembled with each other. The first holder 20A and the second holder 20B have the engagement grooves 50, 51 (insertion portions), respectively. With the structure described above, the operation and advantageous effect in the description (1) above can be achieved, even when the magnetic convergence ring holder includes the two holders arranged in the axial direction, because the two holders (the first holder 20A and the second holder 20B) have the engagement grooves 50, 51 (insertion portions).

(3) In the torque detector according to the present embodiment, the opposite end portions 40a of the magnetic shield 40 in its circumferential serve as the inserting portions. With this structure as well, the operation and advantageous effect in the description (1) above can be achieved.

(4) In the torque detector according to the present embodiment, each of the engagement grooves 50, 51 (insertion portions) is configured such that the distance between an inner surface for restricting movement of the engaging members 41a, 41b as well as the end portion 40a (inserting portion) in the counter-insertion direction, and another inner surface facing the inner surface for restricting the movement, the distance decreases in the counter-insertion direction. With this structure, movement of the engaging members 41a, 41b in the counter-insertion direction can be further restricted.

(5) In the torque detector according to the present embodiment, the engaging members 41a, 41b are formed, through lancing, in the magnetic shield 40. With the structure described above, even when the end portion 40a (inserting portion) of the magnetic shield 40 attempts to move in the counter-insertion direction, the movement of the end portion 40a (inserting portion) of the magnetic shield 40 in the counter-insertion direction is restricted by the engaging members 41a, 41b formed through lancing, because the engaging members 41a, 41b are always engaged with the inner surfaces of the engagement grooves 50, 51 (insertion portions), respectively.

(6) In the torque detector according to the present embodiment, the engaging members 41a, 41b have elasticity, and are elastically engaged with the inner surfaces of the engagement grooves 50, 51 (insertion portions), respectively. With the structure described above, even when the end portion 40a (inserting portion) of the magnetic shield 40 attempts to move in the counter-insertion direction, the movement of the end portion 40a (inserting portion) of the magnetic shield 40 in the counter-insertion direction is restricted by the engaging members 41a, 41b, because the engaging members 41a, 41b are always elastically engaged with the inner surfaces of the engagement grooves 50, 51 (insertion portions), respectively.

Subsequently, a torque detector according to a second embodiment will be described with reference to FIG. 8 and FIG. 9. Note that description of the same structure as that of the first embodiment will be omitted, and the structure different from that of the first embodiment will be described.

Figure 8:
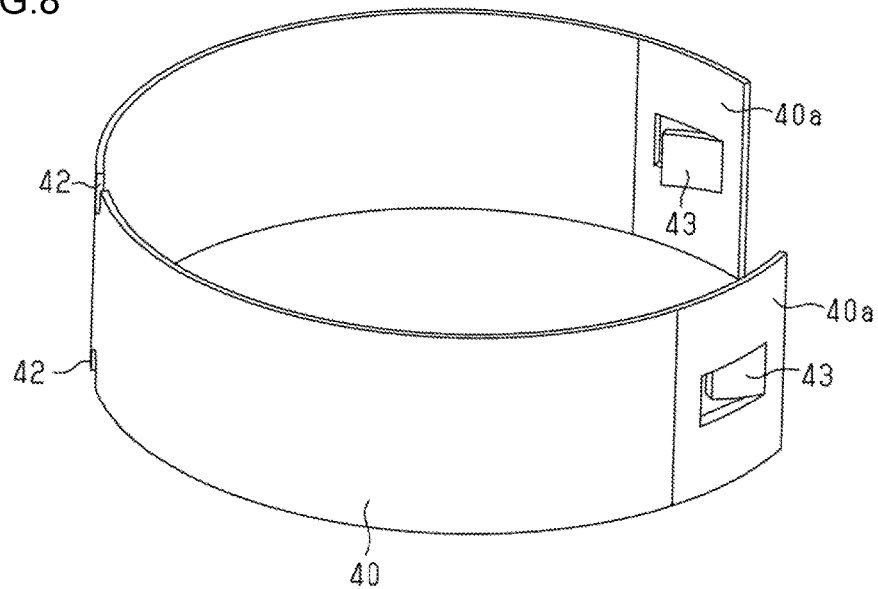
FIG. 8 is a perspective view of a magnetic shield according to another embodiment.

In the present embodiment, as illustrated in FIG. 8, engaging members 43 of a magnetic shield 40 are formed through lancing different from that of the first embodiment. That is, as illustrated in FIG. 8, each of end portions 40a (inserting portion) of the magnetic shield 40 has the engaging member 43 that is formed through lancing so as to be raised inwardly such that its free end points toward a central portion of the magnetic shield 40 in its circumferential direction.

Figure 9:
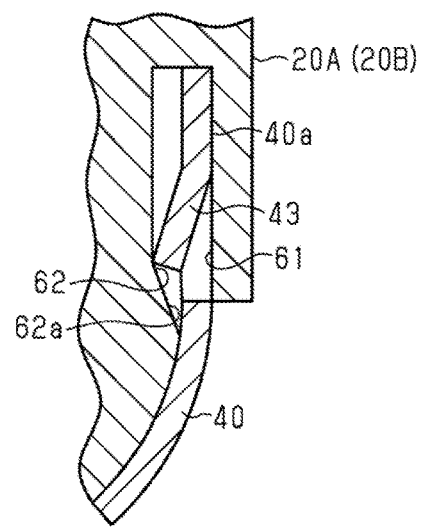
FIG. 9 is a sectional view illustrating a state of engagement between an inserting portion of the magnetic shield and an insertion portion of a magnetic convergence ring holder according to the other embodiment.

An engagement groove 61 serving as an insertion portion is provided in each of a first holder 20A and a second holder 20B that constitute a magnetic convergence ring holder, as illustrated in FIG. 9. In the engagement groove 61, an inner surface 62 facing the engaging member 43 and positioned on the side close to the axis of the holders 20A, 20B, has a tapered surface 62a that is configured such that the distance between the tapered surface 62a and another inner surface facing the tapered surface 62a decreases toward an insertion slot. In the present embodiment as well, the engaging member 43 has elasticity. An insertion direction in the present embodiment is the circumferential direction of the magnetic shield 40, and is a direction in which the magnetic shield 40 is fitted onto the first holder 20A and the second holder 20B from radially outward.

In this case, because the distance between the opposite end portions 40a of the magnetic shield 40 having a C-shaped section is shorter than the outer diameter of each of ring portions 23 of the first holder 20A and the second holder 20B, the distance between the opposite end portions of the magnetic shield 40 is increased in order to insert the end portions into the engagement grooves 61.

In the present embodiment, even when the end portion 40a of the magnetic shield 40 attempts to move in the counter-insertion direction, movement of the end portion 40a in the counter-insertion direction is restricted by the engaging member 43 that is always engaged with the tapered surface 62a that is an inner face of the engagement groove 61. In the present embodiment as well, the magnetic shield 40 is fixed to the first holder 20A and the second holder 20B without the need for a component for fixation of the magnetic shield 40, and no backlash is caused between the magnetic shield 40, and the first and second holders 20A, 20B.

Embodiments of the invention are not limited to the foregoing embodiments, and may be modified as follows. While the engaging member is formed, through lancing, in the magnetic shield 40 in the foregoing embodiments, the method of forming the engaging member is not limited to lancing. For example, an engaging member formed separately from the magnetic shield 40 may be fixed to the magnetic shield 40 in an integral manner. The engaging member may be fixed to the magnetic shield 40 by means of, for example, welding, swaging, or screwing.

While the engaging members 41a, 41b are provided to be inserted into the engagement groove 50 of the first holder 20A and the engagement groove 51 of the second holder 20B, respectively, in the foregoing embodiment, an engagement groove may be provided in only one of the holders, so that an engaging member may be inserted into the engagement groove. In this case, a tapered surface and a guide surface may be provided in an inner surface of the engagement groove of the one of the holders, and the engaging member that is always engaged with the tapered surface may be provided at the end portion 40a.

In the torque detector according to the foregoing embodiment, an outer peripheral portion of each of the first holder 20A and the second holder 20B, an outer surface portion of each of the circuit cover portion 22 and the substrate mounting portion 24, the flanges 28, and the partition wall 30, may be formed by molding.

While the end portion 40a of the magnetic shield 40 is used as the inserting portion, the inserting portion is not limited to the end portion, and thus the inserting portion may be provided in another portion in the magnetic shield 40 in its circumferential direction, such as a central portion in the circumferential direction. In the second embodiment, while the magnetic convergence ring holder includes two holders arranged in the axial direction, that is, the first holder 20A and the second holder 20B, a single magnetic convergence ring holder may be used instead of two holders.

The magnetic shield 40 may have another shape, such as a generally U-shape. In the foregoing embodiment, the tapered surfaces 52a, 53a of the engagement grooves 50, 51 may be omitted. Alternatively, an elastic force of each of the engaging members 41a, 41b may be increased to increase contact force that causes each of the engaging members to be engaged (to be brought into contact) with the corresponding one of the inner surfaces of the engagement grooves 50, 51.

While the engaging members 41a, 41b, and 43 are formed, through lancing, in the magnetic shield 40 so as to be raised radially inward in the foregoing embodiments, the engaging members may be formed, through lancing, so as to be raised radially outward. In this case, a tapered surface formed in each of the inner surfaces of the engagement grooves 50, 51 may be formed in an inner surface on the side opposite to that in the foregoing embodiments.

What is claimed is:

1. A torque detector comprising:
a permanent magnet;
a magnetic yoke disposed within a magnetic field formed by the permanent magnet, the magnetic yoke configured such that a position of the magnetic yoke relative to the permanent magnet varies;
a magnetic convergence unit having a cylindrical shape, the magnetic convergence unit including a magnetic convergence ring holder having a cylindrical shape so as to surround the magnetic yoke, a magnetic convergence ring attached to an inner peripheral surface of the magnetic convergence ring holder to collect a magnetic flux of the magnetic yoke, and a magnetic shield fitted and attached onto an outer peripheral surface of the magnetic convergence ring holder; and
a magnetic sensor configured to detect a magnetic flux of a magnetic circuit formed by the permanent magnet, the magnetic yoke, and the magnetic convergence ring, wherein
the outer peripheral surface of the magnetic convergence ring holder has an insertion portion into which the magnetic shield is inserted when the magnetic shield is fitted onto the magnetic convergence ring holder, and
the magnetic shield has an inserting portion to be inserted into the insertion portion of the magnetic convergence ring holder, the inserting portion having an engaging member that is always engaged with an inner surface of the insertion portion to restrict movement of the inserting portion in a counter-insertion direction during the inserting portion is inserted in the insertion portion.

2. The torque detector according to claim 1, wherein
the magnetic convergence ring holder includes a first holder and a second holder, the first holder being assembled with the second holder with the first holder and the second holder arranged in an axial direction, and
at least one of the first holder and the second holder has the insertion portion.

3. The torque detector according to claim 1, wherein the inserting portion is provided in each of both end portions of the magnetic shield in a circumferential direction.

4. The torque detector according to claim 1, wherein
the insertion portion has a first inner surface and a second inner surface configured to restrict relative movement between the engaging member and the insertion portion in a counter-insertion direction, and
the first inner surface is configured such that a distance between the first inner surface and the second inner surface facing the first inner surface decreases in the counter-insertion direction.

5. The torque detector according to claim 1, wherein the engaging member is formed so as to project from a surface of the magnetic shield.

6. The torque detector according to claim 1, wherein
the engaging member has elasticity, and
the engaging member is elastically engaged with the inner surface of the insertion portion.

* * * * *